(12) United States Patent
Tu et al.

(10) Patent No.: US 10,692,917 B2
(45) Date of Patent: Jun. 23, 2020

(54) SENSOR PACKAGE STRUCTURE

(71) Applicant: KINGPAK TECHNOLOGY INC., Hsin-Chu County (TW)

(72) Inventors: Hsiu-Wen Tu, Hsin-Chu County (TW); Chung-Hsien Hsin, Hsin-Chu County (TW); Jian-Ru Chen, Hsin-Chu County (TW)

(73) Assignee: KINGPAK TECHNOLOGY INC., Hsin-Chu County (TW)

(*) Notice: Subject to any disclaimer, the term of this patent is extended or adjusted under 35 U.S.C. 154(b) by 156 days.

(21) Appl. No.: 16/133,874

(22) Filed: Sep. 18, 2018

(65) Prior Publication Data

US 2019/0019834 A1   Jan. 17, 2019

Related U.S. Application Data

(63) Continuation-in-part of application No. 15/641,378, filed on Jul. 5, 2017, now Pat. No. 10,186,538.
(Continued)

(30) Foreign Application Priority Data

Sep. 30, 2016 (CN) .......................... 2016 1 0868073

(51) Int. Cl.
*H01L 31/0203* (2014.01)
*H01L 27/146* (2006.01)
(Continued)

(52) U.S. Cl.
CPC .. *H01L 27/14636* (2013.01); *H01L 23/49811* (2013.01); *H01L 24/04* (2013.01);
(Continued)

(58) Field of Classification Search
CPC ......... H01L 27/14636; H01L 23/49811; H01L 27/146
(Continued)

(56) References Cited

U.S. PATENT DOCUMENTS 5,468,999 A * 11/1995 Lin ..................... H01L 23/24
257/700
6,137,183 A * 10/2000 Sako ................... H01L 21/563
257/782
(Continued)

FOREIGN PATENT DOCUMENTS

JP         2002-76154 A      3/2002

*Primary Examiner* — Caleb E Henry
(74) *Attorney, Agent, or Firm* — Li & Cai Intellectual Property (USA) Office

(57) ABSTRACT

A sensor package structure includes a substrate, a sensor chip disposed on the substrate, a plurality of metal wires electrically connecting the sensor chip to the substrate, a light-permeable layer, a combining layer connecting a portion of the light-permeable layer onto the sensor chip, and a packaging compound covering lateral sides of the sensor chip, the light-permeable layer, and the combining layer. Each of the metal wires is embedded in the combining layer and the packaging compound, and has a diameter within a range of 0.8-1.1 mil. Each of the metal wires includes a first segment connected to the substrate and a second segment connected to the sensor chip. In each of the metal wires, the second segment integrally and curvedly extends from the first segment, and the second segment and a top surface of the sensor chip have a sloping angle within a range of 5-45 degrees.

15 Claims, 15 Drawing Sheets

Related U.S. Application Data

(60) Provisional application No. 62/358,643, filed on Jul. 6, 2016.

(51) Int. Cl.
*H01L 23/00* (2006.01)
*H01L 23/498* (2006.01)

(52) U.S. Cl.
CPC .............. *H01L 24/32* (2013.01); *H01L 24/48* (2013.01); *H01L 24/49* (2013.01); *H01L 24/73* (2013.01); *H01L 31/0203* (2013.01); *H01L 2224/04042* (2013.01); *H01L 2224/32225* (2013.01); *H01L 2224/48091* (2013.01); *H01L 2224/48227* (2013.01); *H01L 2224/48471* (2013.01); *H01L 2224/49171* (2013.01); *H01L 2224/73265* (2013.01); *H01L 2924/2076* (2013.01); *H01L 2924/20758* (2013.01); *H01L 2924/20759* (2013.01)

(58) Field of Classification Search
USPC .......................................................... 257/434
See application file for complete search history.

(56) References Cited

U.S. PATENT DOCUMENTS

| | | | | |
|---|---|---|---|---|
| 6,157,085 | A * | 12/2000 | Terashima | H01L 23/3128 257/691 |
| 8,969,120 | B2 * | 3/2015 | Huang | H01L 27/14618 438/64 |
| 10,186,538 | B2 * | 1/2019 | Tu | H01L 27/14618 |
| 10,236,313 | B2 * | 3/2019 | Tu | H01L 27/1469 |
| 2007/0272846 | A1 * | 11/2007 | Wu | H01L 27/14683 250/239 |
| 2009/0166784 | A1 * | 7/2009 | Honda | H01L 31/0203 257/432 |
| 2018/0012919 | A1 * | 1/2018 | Tu | H01L 27/1469 |

* cited by examiner

SENSOR PACKAGE STRUCTURE

CROSS-REFERENCE TO RELATED PATENT APPLICATION

This U.S. Non-provisional application for patent is a continuation-in-part application of patent application Ser. No. 15/641,378 filed on Jul. 5, 2017, which claims the priority of the U.S. Provisional Patent Application Ser. No. 62/358,643 filed Jul. 6, 2016 and claims the priority of China patent application serial no. 201610868073.1, filed Sep. 30, 2016. The entirety of each of the above-mentioned patent applications is hereby incorporated by reference herein and made as a part of this specification.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present invention relates to a package structure; in particular, to a sensor package structure.

BACKGROUND OF THE DISCLOSURE

Electronic components within a conventional electronic device need to be developed toward being smaller in size, such that more electronic components can be disposed within the conventional electronic device. However, the conventional sensor package structure (e.g., an image sensor package structure) is not suitable for packaging a sensor chip of smaller size, rendering the task of miniaturization a difficult one. Moreover, in order to establish the electrical connection between a sensor chip and a substrate of the conventional sensor package structure, all metal wires of the conventional sensor package structure cannot be formed with any fail problems.

SUMMARY OF THE DISCLOSURE

In response to the above-referenced technical inadequacies, the present disclosure provides a sensor package structure for effectively improving the issues associated with conventional sensor package structures.

In one aspect, the present disclosure provides a sensor package structure, includes a substrate, a sensor chip, a chip-bonding adhesive, a plurality of metal wires, a combining layer, a light-permeable layer, and a packaging compound. The substrate has an upper surface and a lower surface opposite to the upper surface. The substrate includes a plurality of welding pads formed on the upper surface. The sensor chip has a top surface, a bottom surface opposite to the top surface, and a lateral side arranged between the top surface and the bottom surface. The bottom surface of the sensor chip is entirely adhered to the upper surface of the substrate through the chip-bonding adhesive. The chip-bonding adhesive protrudes from the lateral side of the sensor chip so as to ensure no bubble generated between the bottom surface of the sensor chip and the upper surface of the substrate. The top surface has a sensing region and a spacing region arranged around the sensing region, the top surface has a plurality of edges, and the sensor chip includes a plurality of connecting pads formed on a portion of the top surface between the spacing region and at least one of the edges. One ends of the metal wires are respectively connected to the welding pads, and the other ends of the metal wires are respectively connected to the connecting pads. Each of the metal wires has a diameter within a range of 0.8-1.1 mil, and includes a first segment and a second segment. The first segment of each of the metal wires is connected to the corresponding welding pad. The second segment of each of the metal wires is connected to the corresponding connecting pad. In each of the metal wires, the second segment integrally and curvedly extends from an end of the first segment away from the corresponding welding pad, and the second segment and the top surface of the sensor chip have a sloping angle there-between that is within a range of 5-45 degrees. A portion of each of the welding pads connected to the first segment of the corresponding metal wire is spaced apart from the lateral side of the sensor chip by a distance that is within a range of 210-660 µm so as to allow the welding pads being spaced apart from the chip-bonding adhesive. The combining layer is disposed on the portion of the top surface between the at least one of the edges of the top surface and the spacing region. A part of the second segment of each of the metal wires is embedded in the combining layer. The light-permeable layer has a first surface and a second surface opposite to the first surface. A portion of the second surface of the light-permeable layer is adhered to the combining layer. The second surface has a fixing region arranged outside the portion of the second surface adhered to the combining layer, and a projecting area defined by orthogonally projecting the sensor chip onto the second surface is entirely located in the second surface. The packaging compound is disposed on the upper surface of the substrate and covers the lateral side of the sensor chip, a lateral side of the combining layer, and a lateral side and the fixing region of the light-permeable layer. The first segment and the other part of the second segment of each of the metal wires and each of the welding pads are embedded in the packaging compound.

In one aspect, the present disclosure provides a sensor package structure, which includes a substrate, a sensor chip, a chip-bonding adhesive, a plurality of metal wires, a combining layer, a light-permeable layer, and a packaging compound. The substrate has an upper surface and a lower surface opposite to the upper surface. The substrate includes a plurality of welding pads formed on the upper surface. The sensor chip has a top surface, a bottom surface opposite to the top surface, and a lateral side arranged between the top surface and the bottom surface. The bottom surface of the sensor chip is disposed on the upper surface of the substrate, the top surface has a sensing region and a spacing region arranged around the sensing region. The top surface has a plurality of edges, and the sensor chip includes a plurality of connecting pads formed on a portion of the top surface between the spacing region and at least one of the edges. One ends of the metal wires are respectively connected to the welding pads, and the other ends of the metal wires are respectively connected to the connecting pads. Each of the metal wires has a diameter within a range of 0.8-1.1 mil, and includes a first segment and a second segment. The first segment of each of the metal wires is connected to the corresponding welding pad. The second segment of each of the metal wires is connected to the corresponding connecting pad. In each of the metal wires, the second segment integrally and curvedly extends from an end of the first segment away from the corresponding welding pad, and the second segment and the top surface of the sensor chip have a sloping angle there-between that is within a range of 5-45 degrees. The combining layer is disposed on the portion of the top surface between the at least one of the edges of the top surface and the spacing region. A part of the second segment of each of the metal wires is embedded in the combining layer. The light-permeable layer has a first surface and a second surface opposite to the first surface, and a portion of the second surface of the light-permeable layer is adhered to the combining layer. The second surface has a fixing region arranged outside the portion of the second surface adhered to the combining layer, and a projecting area defined by orthogonally projecting the sensor chip onto the second surface is entirely located in the second surface. The packaging compound is disposed on the upper surface of the substrate and covers the lateral side of the sensor chip, a lateral side of the combining layer, and a lateral side and the fixing region of the light-permeable layer, wherein the first segment and the other part of the second segment of each of the metal wires and each of the welding pads are embedded in the packaging compound.

Therefore, the sensor package structure can easily package the smaller sensor chip by embedding each of the metal wires in the combining layer and the packaging compound. Specifically, each of the metal wires can be formed with the following conditions to avoid occurring a fail problem, such as: each of the metal wires has a diameter within a range of 0.8-1.1 mil, and the second segment of each of the metal wires and the top surface of the sensor chip have a sloping angle there-between that is within a range of 5-45 degrees.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
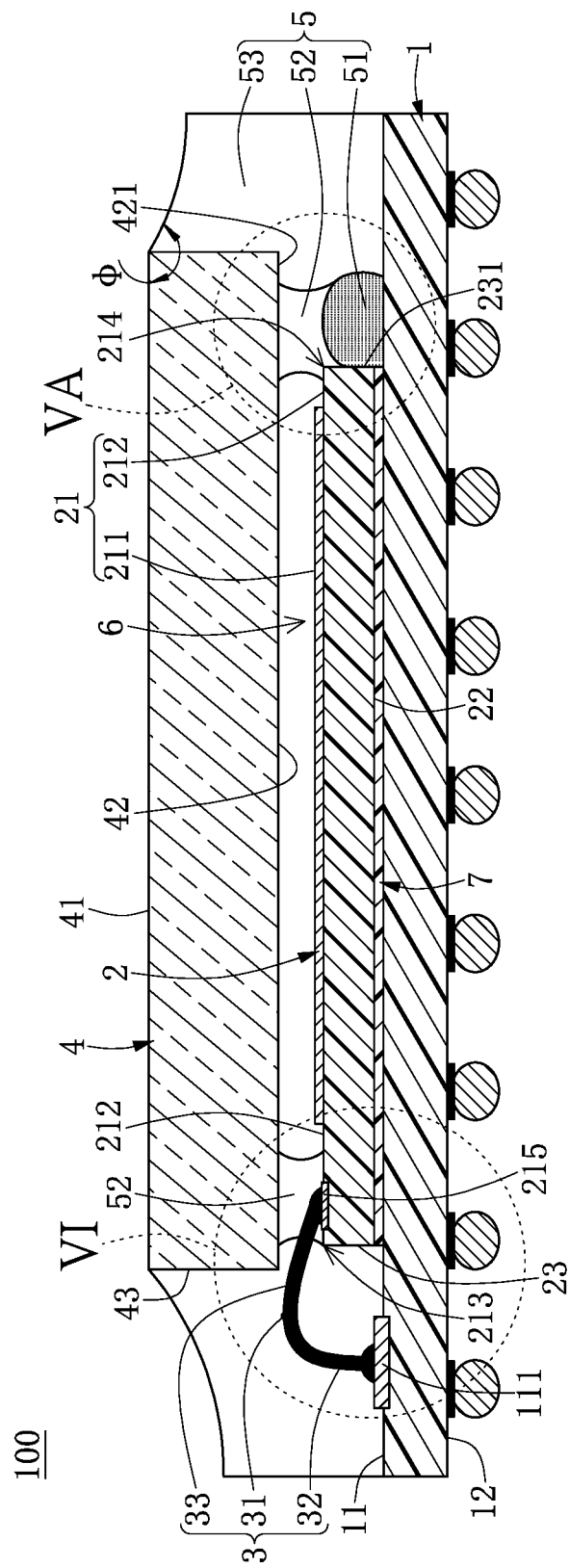
FIG. 1 is a cross-sectional view showing a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
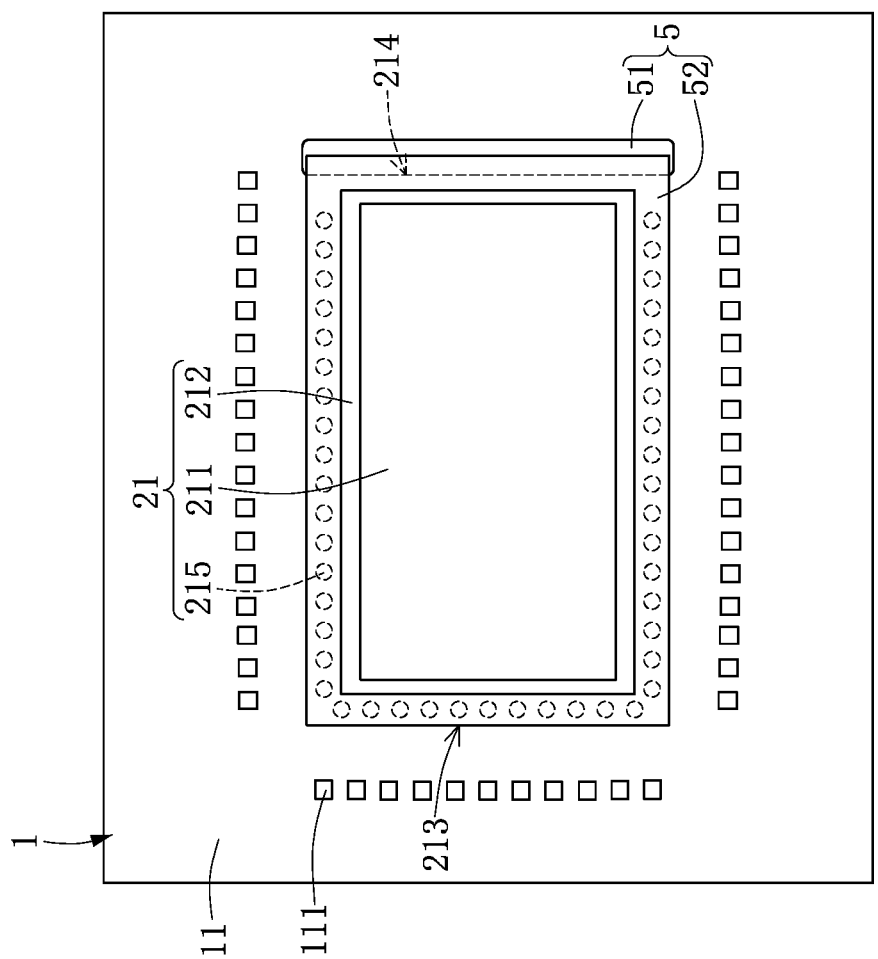
FIG. 2 is a top view of FIG. 1 with the packaging compound, the light-permeable layer, and the metal wires omitted.
Figure 3:
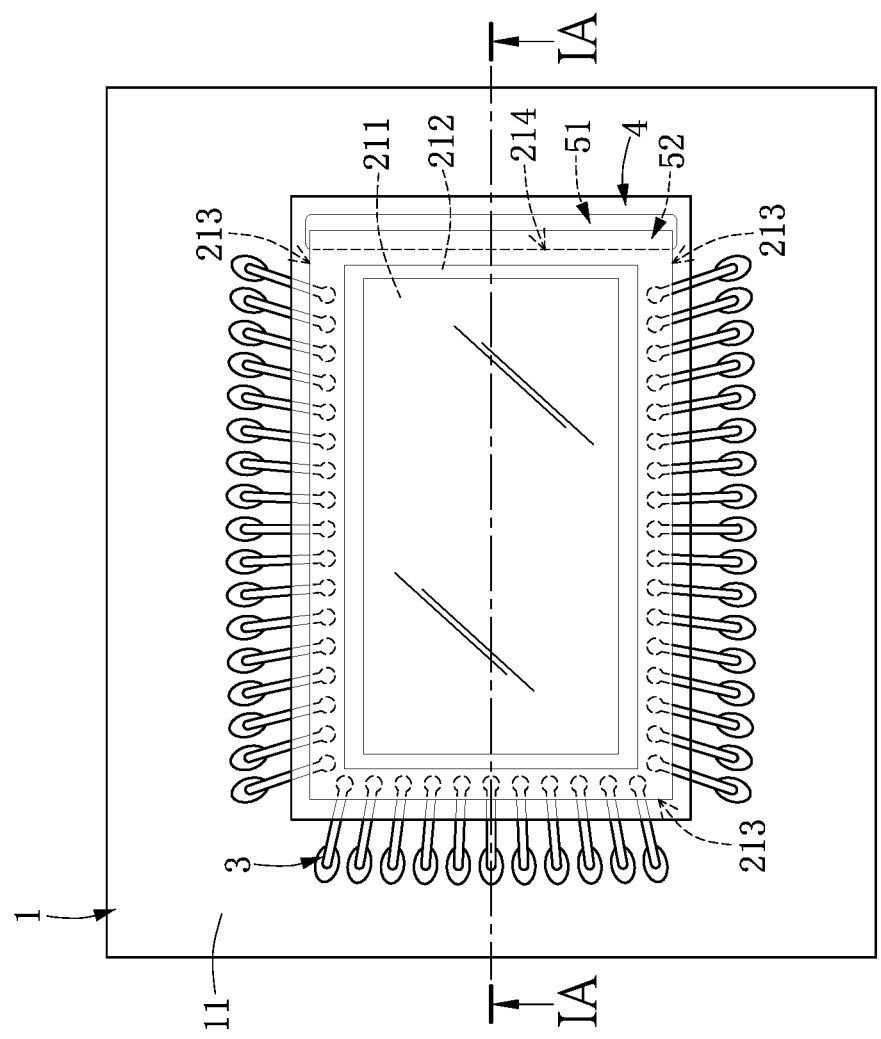
FIG. 3 is a top view of FIG. 1 with the packaging compound omitted.

Reference is made to FIG. 1 to FIG. 9, which illustrate a first embodiment of the present disclosure. As shown in FIG. 1 to FIG. 3, the present embodiment provides, but is not limited to, a sensor package structure 100 (i.e., an image sensor package structure 100). The sensor package structure 100 includes a substrate 1, a sensor chip 2 disposed on the substrate 1, a plurality of metal wires 3 establishing an electrical connection between the substrate 1 and the sensor chip 2, a light-permeable layer 4 corresponding in position to the sensor chip 2, and an adhesive 5 firmly adhering the light-permeable layer 4 to the sensor chip 2 and the substrate 1. The following description discloses the structure and connection relationships of each component of the sensor package structure 100.

As shown in FIG. 1 and FIG. 2, the substrate 1 can be a plastic substrate, a ceramic substrate, a lead frame, or a substrate made of other materials, but the present embodiment is not limited thereto. The substrate 1 has an upper surface 11 and a lower surface 12 opposite to the upper surface 11. The substrate 1 includes a plurality of welding pads 111 formed on the upper surface 11. Moreover, the substrate 1 also includes a plurality of welding pads (not labeled) formed on the lower surface 12 for respectively soldering a plurality of soldering balls (not labeled). In other words, the substrate 1 of the present embodiment exemplarily has a ball grid array (BGA) arrangement, but the present disclosure is not limited thereto.

Figure 4:
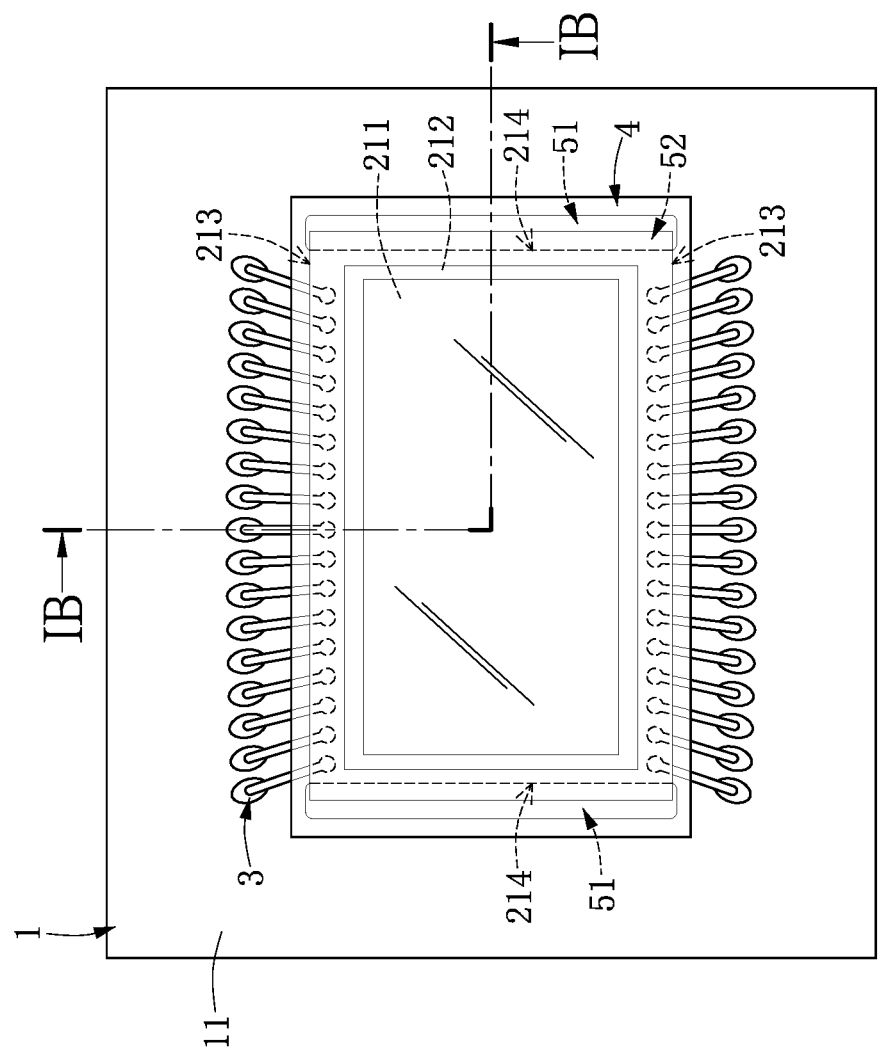
FIG. 4 is a top view of FIG. 1 in another configuration according to the first embodiment with the packaging compound omitted.

As shown in FIG. 1 and FIG. 2, the sensor chip 2 in the present embodiment is exemplarily an image sensor chip, but the present disclosure is not limited thereto. The sensor chip 2 has a top surface 21, a bottom surface 22 opposite to the top surface 21, and a lateral side 23 perpendicularly connected to the top surface 21 and the bottom surface 22. In the present disclosure, the lateral side means the side(s) other than the top side and the bottom side. The top surface 21 has a sensing region 211 and a spacing region 212 arranged around the sensing region 211. The sensing region 211 in the present embodiment is in a square shape or a rectangular shape. The center of the sensing region 211 can be the center of the top surface 21 (as shown in FIG. 4), or the center of the sensing region 211 can be arranged apart from the center of the top surface 21 at a distance (as shown in FIG. 2 and FIG. 3). The spacing region 212 in the present embodiment is in a square-ring shape, and each portion of the spacing region 212 has the same width. The specific shape of the spacing region 212 can be adjusted according to practical needs.

Figure 5A:
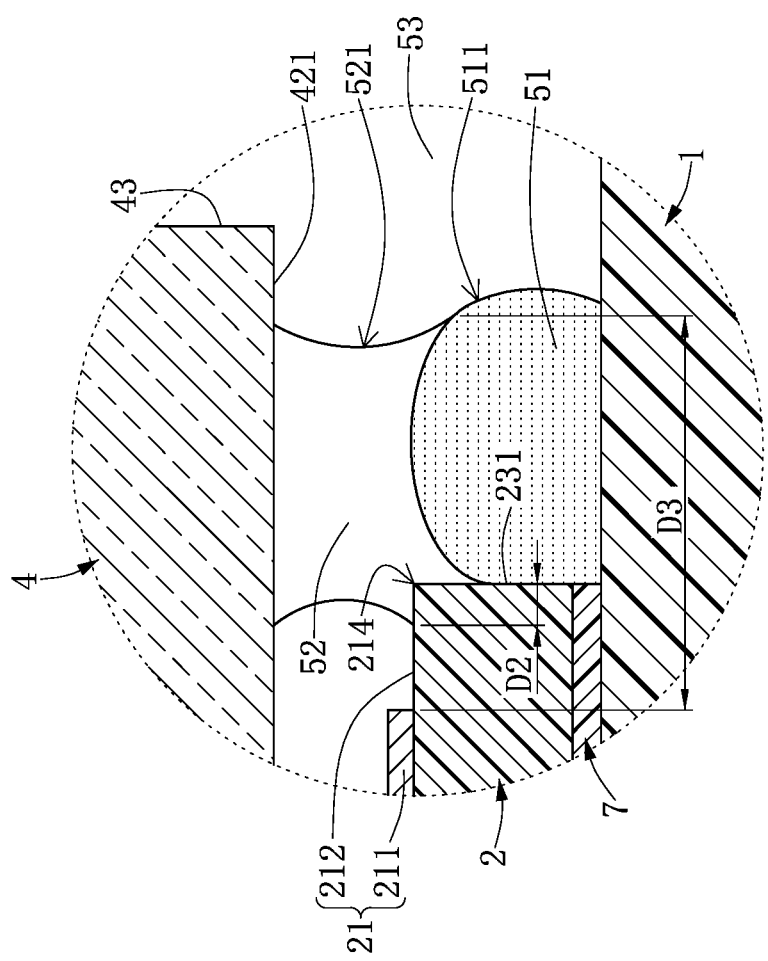
FIG. 5A is an enlarged view of portion VA of FIG. 1.
Figure 6:
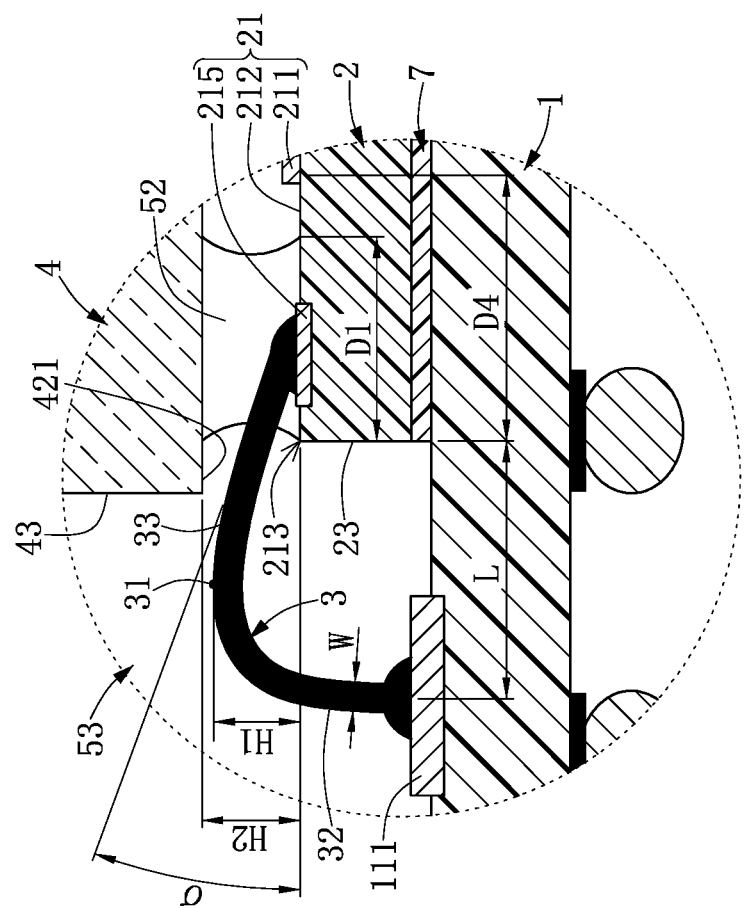
FIG. 6 is an enlarged view of portion VI of FIG. 1.

Specifically, the top surface 21 has at least one first edge 213 and at least one second edge 214, and the first edge 213 and the second edge 214 are arranged outside the spacing region 212. The lateral side 23 has at least one side surface 231 connected to the at least one second edge 214. A distance D1 between the first edge 213 and the spacing region 212 (as shown in FIG. 6) is greater than a distance D2 between the second edge 214 and the spacing region 212 (as shown in FIG. 5A). In the present embodiment, the distance D2 is smaller than ⅓~¼ of the distance D1 (D2<⅓~¼ D1), but the ratio between the distance D1 and the distance D2 can be adjusted according to practical needs. The sensor chip 2 includes a plurality of connecting pads 215 formed on a first portion of the top surface 21 between the first edge 213 and the spacing region 212, and a second portion of the top surface 21 between the second edge 214 and the spacing region 212 is provided without any connecting pad 215.

The top surface 21 can be formed with a plurality of first edges 213 and a single second edge 214 (as shown in FIG. 3), or the top surface 21 can also be formed with a plurality of first edges 213 and a plurality of second edges 214 (as shown in FIG. 4). In other words, FIG. 1 can be a cross-sectional view taken along a cross-sectional line IA-IA of FIG. 3 or taken along a cross-sectional line IB-IB of FIG. 4. In other embodiments of the present disclosure, the top surface 21 can be formed with a single first edge 213 and a plurality of second edges 214.

Moreover, the bottom surface 22 of the sensor chip 2 is disposed on the upper surface 11 of the substrate 1 through a chip-bonding adhesive 7 of the sensor package structure 100, and a portion of the upper surface 11 for mounting the sensor chip 2 is substantially arranged in a region, which is surroundingly defined by the welding pads 111. In the present embodiment, the bottom surface 22 of the sensor chip 2 is fixed on the upper surface 11 of the substrate 1 by using a die attach epoxy (not labeled), but the present disclosure is not limited thereto.

As shown in FIG. 1 to FIG. 3, one ends of the metal wires 3 are respectively connected to the welding pads 111 of the substrate 1, and the other ends of the metal wires 3 are respectively connected to the connecting pads 215 of the sensor chip 2. In the present embodiment, each of the metal wires 3 is in a reverse bond mode, and the top surface 21 of the sensor chip 2 and an adjacent portion of each of the metal wires 3 (i.e., a portion of each of the metal wires 3 arranged above the top surface 21 as shown in FIG. 1) have a sloping angle σ smaller than or equal to 45 degrees. Thus, an apex 31 of each of the metal wires 3 can be located at a lower height for avoiding contact with the light-permeable layer 4, but the present disclosure is not limited thereto. For example, the angle can be smaller than or equal to 30 degrees.

As shown in FIG. 1 to FIG. 3, the light-permeable layer 4 in the present embodiment is exemplarily a glass plate, but is not limited thereto. For example, the light-permeable layer 4 can be a transparent plate or a semi-transparent plate. The light-permeable layer 4 has a first surface 41, a second surface 42 opposite to the first surface 41, and a lateral side 43 perpendicularly connected to the first surface 41 and the second surface 42. In the present embodiment, the first surface 41 and the second surface 42 have the same square shape or the same rectangular shape, and an area of the second surface 42 is greater than that of the top surface 21 of the sensor chip 2, but the present disclosure is not limited thereto.

Moreover, the light-permeable layer 4 is fixed on the substrate 1 and the sensor chip 2 by using the adhesive 5, and the second surface 42 of the light-permeable layer 4 is substantially parallel to and faces toward the top surface 21 of the sensor chip 2. Specifically, a projecting area (not labeled) defined by orthogonally projecting the sensor chip 2 onto the second surface 42 is entirely located in the second surface 42. In addition, the second surface 42 of the light-permeable layer 4 is arranged adjacent to, but does not contact with, each of the metal wires 3. The apex 31 of each of the metal wires 3 is arranged outside a space defined by orthogonally projecting the light-permeable layer 4 to the substrate 1. As shown in FIG. 1 and FIG. 6, a height H1 of the apex 31 of each of the metal wires 3 with respect to the top surface 21 of the sensor chip 2 is preferably smaller than a height H2 of the second surface 42 of the light-permeable layer 4 with respect to the top surface 21 of the sensor chip 2, but the present disclosure is not limited thereto.

Specifically, the height H2 of the second surface 42 of the light-permeable layer 4 with respect to the top surface 21 of the sensor chip 2 is within a range of 120-200 μm, and the height H1 of the apex 31 of each of the metal wires 3 with respect to the top surface 21 of the sensor chip 2 is within a range of 30-150 μm (e.g., 50-100 μm is preferable).

As shown in FIG. 1, FIG. 5A, and FIG. 6, the adhesive 5 can be a single piece made of the same material or a composite piece made of different materials, but the present embodiment is not limited thereto. The adhesive 5 is disposed on the upper surface 11 of the substrate 1 and covers the lateral side 23 of the sensor chip 2, the first portion of the top surface 21 between the first edge 213 and the spacing region 212, and the lateral side 43 and a portion of the second surface 42 of the light-permeable layer 4. At least part of each of the metal wires 3 and each of the welding pads 111 are embedded in the adhesive 5.

Specifically, the adhesive 5 in the present embodiment includes a supporting layer 51, a combining layer 52, and a packaging compound 53, the three of which are connected with each other. The material of the supporting layer 51 (i.e., a glass mount epoxy) is preferably to be same as that of the combining layer 52, but the material of the packaging compound 53 (i.e., a liquid compound) is preferably different from that of the supporting layer 51. The following description discloses the connection relationships of each part of the adhesive 5 with respect to the other components.

As shown in FIG. 1, FIG. 2 and FIG. 5A, the supporting layer 51 in the present embodiment corresponds in shape and position to the second edge 214 of the top surface 21 of the sensor chip 2. For example, the supporting layer 51 as shown in FIG. 3 is an elongated structure substantially parallel to the second edge 214, or the supporting layer 51 as shown in FIG. 4 includes two elongated structures respectively parallel to the two second edges 214. The supporting layer 51 is arranged adjacent to the second edge 214 of the sensor chip 2 (i.e., the supporting layer 51 contacts the side surface 231 of the sensor chip 2 connected to the second edge 214). An edge of the supporting layer 51 (i.e., the top edge of the supporting layer 51 as shown in FIG. 5A) arranged distant from the substrate 1 has a height substantially equal to a height of the top surface 21 (or the second edge 214) of the sensor chip 2.

Figure 5B:
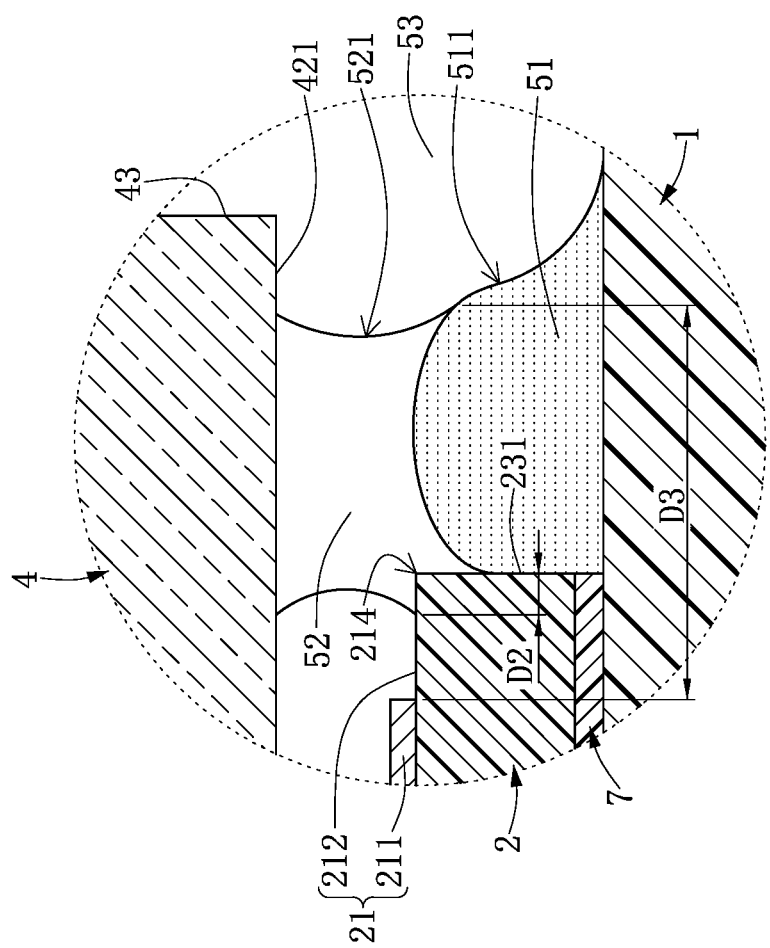
FIG. 5B is an enlarged view showing another configuration of FIG. 5A according to the first embodiment.

Specifically, an outer side 511 of the supporting layer 51 arranged distant from the sensor chip 2 includes an arc surface 511 having a center of circle (not labeled) located at an interior side of the packaging compound 53 (i.e., the center of circle is located in the supporting layer 51), but the present disclosure in not limited thereto. For example, as shown in FIG. 5B, the center of circle (not labeled) of the arc surface 511 can be located in the packaging compound 53.

As shown in FIG. 2, FIG. 5A, and FIG. 6, the combining layer 52 is substantially in a square ring shape or a rectangular ring shape, and an inner edge of the combining layer 52 is preferably connected to the an outer edge of the spacing region 212 of the sensor chip 2. That is to say, the spacing region 212 is provided for separating the combining layer 52 from the sensing region 211. The combining layer 52 is disposed on the supporting layer 51 and the first portion of the top surface 21, the latter of which is disposed between the first edge 213 and the spacing region 212, and a portion of the combining layer 52 disposed on the supporting layer 51 (as shown in FIG. 5A) is further disposed on the second portion of the top surface 21 between the second edge 214 and the spacing region 212. An area of the second portion of the top surface 21 is preferably smaller than that of a portion of the spacing region 212 connected to the second portion of the top surface 21. In other words, in other embodiments of the present disclosure, when the portion of the combining layer 52 disposed on the supporting layer 51 is not disposed on the top surface 21, the second edge 214 of the top surface 21 is an outer edge of the spacing region 212.

Specifically, a width and a height of the portion of the combining layer 52 disposed on the supporting layer 51 (as shown in FIG. 5A) are substantially equal to that of a portion of the combining layer 52 disposed on first portion of the top surface 21 (as shown in FIG. 6). A lateral side 521 of the combining layer 52 arranged distant from the sensing region 211 includes an arc surface 521 having a center of circle located in the packaging compound 53. A largest distance D3 (as shown in FIG. 5A) between the arc surface 521 of the combining layer 52 and the sensing region 211 is preferably and substantially equal to a distance D4 (as shown in FIG. 6) between the first edge 213 and the sensing region 211. In a cross-section of the sensor package structure 100 perpendicular to the upper surface 11 (as shown in FIG. 5A), the arc surface 521 of the combining layer 52 and the arc surface 511 of the supporting layer 51 are in an S-shape, but the present disclosure is not limited thereto (i.e., FIG. 5B).

Moreover, a part of each of the metal wires 3 is embedded in the combining layer 52. In other words, each of the connecting pads 215 and a part of the corresponding metal wire 3 connected thereto in the present embodiment are embedded in the combining layer 52. However, in other embodiments of the present disclosure, each of the connecting pads 215 and a part of the corresponding metal wire 3 connected thereto can be not embedded in the combining layer 52.

In addition, as shown in FIG. 1, a portion the second surface 42 of the light-permeable layer 4 is adhered to the combining layer 52, so that the second surface 42 of the light-permeable layer 4, the combining layer 52, and the top surface 21 of the sensor chip 2 surroundingly co-define an enclosed space 6, and the sensing region 211 of the sensor chip 2 is arranged in the enclosed space 6. The second surface 42 has a fixing region 421 arranged outside the portion of the second surface 42 adhered to the combining layer 52, and the fixing region 421 is in a square ring shape or a rectangular ring shape.

As shown in FIG. 1, FIG. 5A, and FIG. 6, the packaging compound 53 is disposed on the upper surface 11 of the substrate 1 and covers the lateral side 23 of the sensor chip 2, the outer side 511 of the supporting layer 51, the lateral side 521 of the combining layer 52, and the lateral side 43 and the fixing region 421 of the light-permeable layer 4. Each of the metal wires 3 in the present embodiment is embedded in the packaging compound 53 and the combining layer 52, and the apex 31 of each of the metal wires 3 is embedded in the packaging compound 53. However, in other embodiments of the present disclosure, each of the metal wires 3 can be embedded entirely in the packaging compound 53.

Specifically, the first surface 41 of the light-permeable layer 4 and an adjacent surface of the packaging compound 53 (i.e., the top surface of the packaging compound 53 as shown in FIG. 1) have an angle Φ within a range of 90~180 degrees, and the angle Φ is preferably within a range of 115~150 degrees. A lateral side surface of the packaging compound 53 other than the top surface and the bottom surface is substantially flush with a lateral side surface of the substrate 1. Moreover, the packaging compound 53 in the present embodiment is not disposed on the first surface 41 of the light-permeable layer 4, but the packaging compound 53 in other embodiments of the present disclosure can be disposed on a part of the first surface 41 (i.e., a periphery part of the first surface 41) of the light-permeable layer 4.

In summary, the sensor chip 2 in the present embodiment, which has the second portion provided without any connecting pad 215, can be adapted in the sensor package structure 100. That is to say, the sensor package structure 100 of the present embodiment can be suitable to package the sensor chip 2 which has a smaller size. Furthermore, the sensor package structure 100 can also package the smaller sensor chip 2 by embedding part of each of the metal wires 3 in the combining layer 52.

The light-permeable layer 4 can be firmly fixed at a predetermined position by adhering the packaging compound 53 to the arc surface 511 of the supporting layer 51, the arc surface 521 of the combining layer 52, and the lateral side 43 and the fixing region 421 of the light-permeable layer 4. Moreover, the light-permeable layer 4 can be maintained to not contact each of the metal wires 3, so that the light-permeable layer 4 is substantially parallel to the top surface 21 of the sensor chip 2, thereby providing a better reliability of the sensor package structure 100.

The supporting layer 51 is formed in one process, and the combining layer 52 is later formed in another process, so that the supporting layer 51 is formed to be an extension for a shorter portion of the sensor chip 2 (i.e., the second portion of the top surface 21 between the sensing region 211 and the second edge 214). Thus, the supporting layer 51 can provide a space sufficient to receive the combining layer 52, preventing the combining layer 52 from contacting the sensing region 211.

In addition, the sensor package structure 100 as shown in FIG. 1 to FIG. 6 can be adjusted according to practical needs, but as the present disclosure cannot disclose all varieties of configurations, the following description will only disclose some exemplary configurations of the sensor package structure 100.

Figure 7:
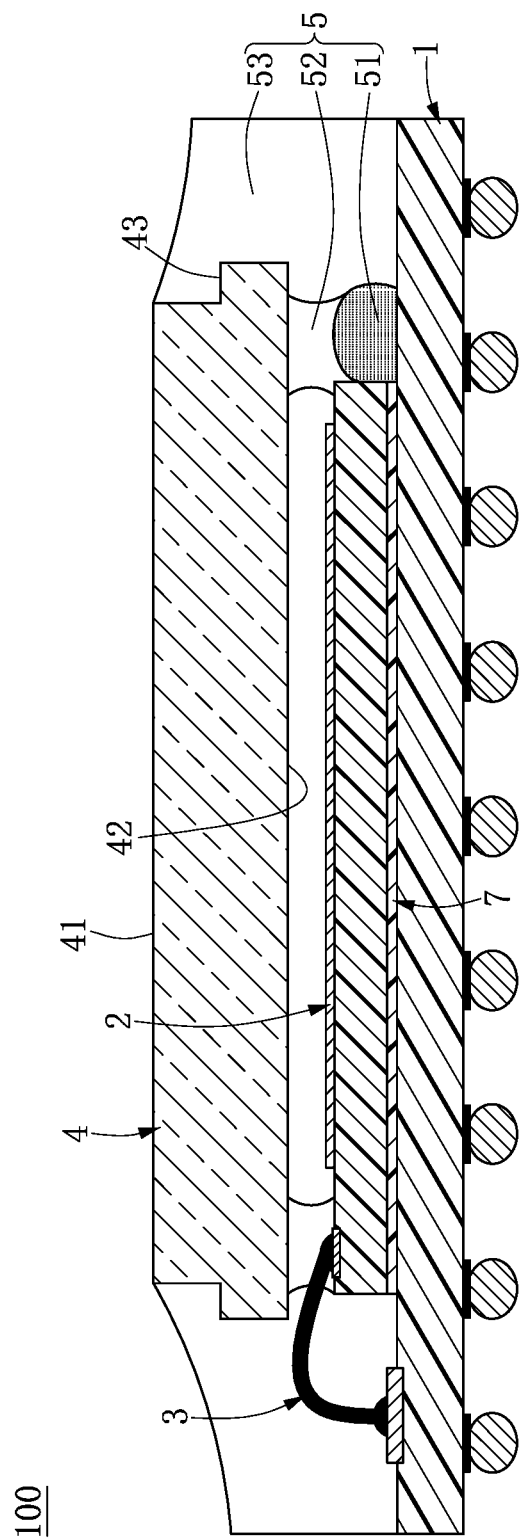
FIG. 7 is a cross-sectional view showing the sensor package structure in yet another configuration according to the first embodiment.

As shown in FIG. 7, the lateral side 43 of the light-permeable layer 4 is in a step shape and is embedded in the packaging compound 53. An area of the first surface 41 is smaller than that of the second surface 42. However, in other embodiments of the present disclosure, the area of the first surface 41 can be greater than that of the second surface 42.

Figure 8:
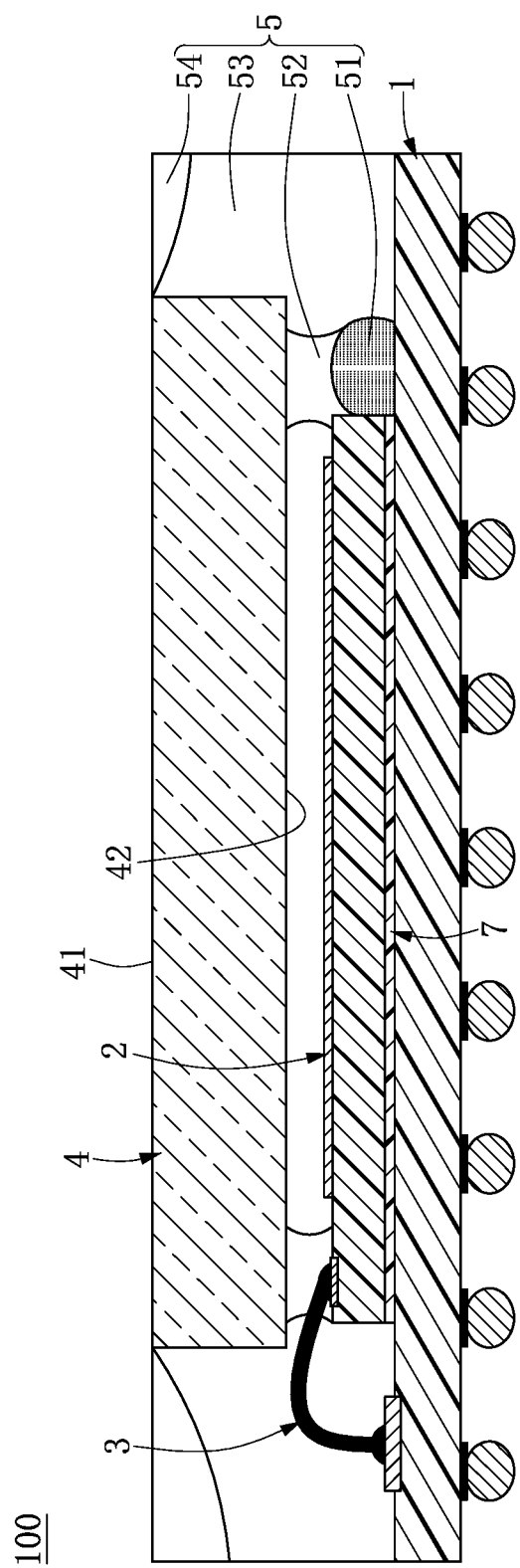
FIG. 8 is a cross-sectional view showing the sensor package structure in yet another configuration according to the first embodiment.

As shown in FIG. 8, the sensor package structure 100 can further include a molding compound 54 disposed on a top surface of the packaging compound 53. A top surface of the molding compound 54 is substantially parallel to the first surface 41 of the light-permeable layer 41, and a lateral side surface of the molding compound 54 other than the top surface and the bottom surface is coplanar with a lateral side surface of the packaging compound 53, but the present disclosure is not limited thereto. Moreover, the top surface of the molding compound 54 can be substantially coplanar with the first surface 41 of the light-permeable layer 41.

Figure 9:
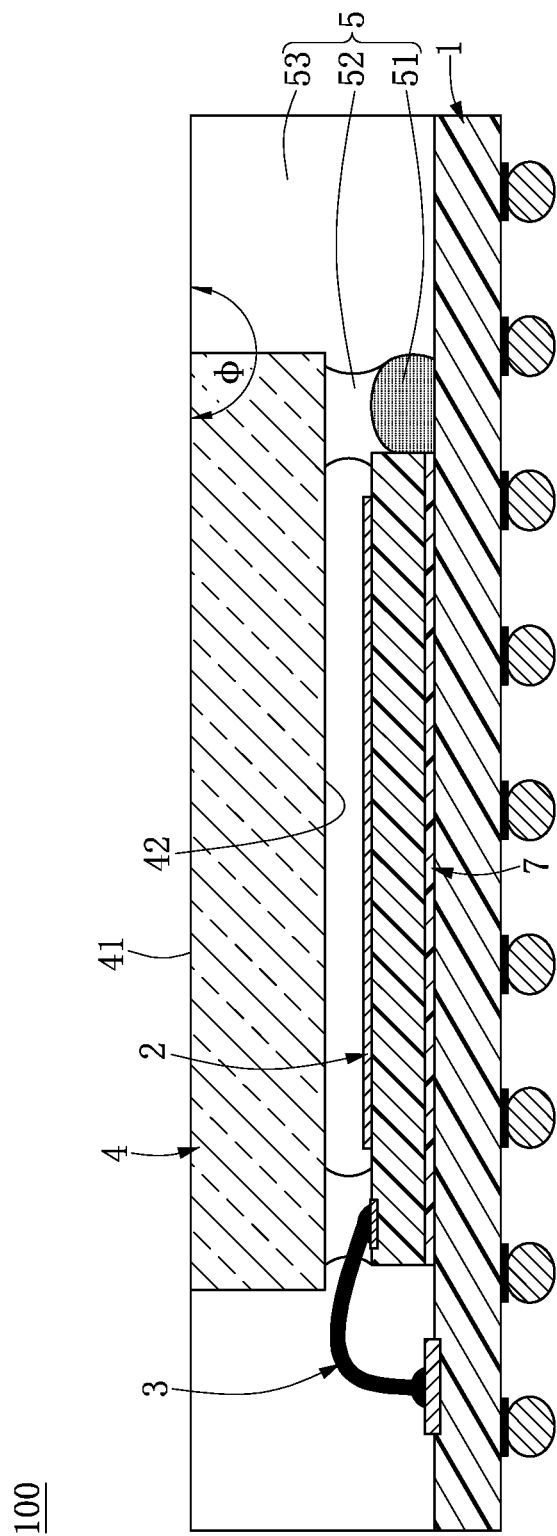
FIG. 9 is a cross-sectional view showing the sensor package structure in yet another configuration according to the first embodiment.

As shown in FIG. 9, the packaging compound 53 can be a molding compound, and the first surface 41 of the light-permeable layer 4 is substantially parallel to an adjacent surface of the packaging compound 53. Moreover, the first surface 41 of the light-permeable layer 4 and the adjacent surface of the packaging compound 53 preferably have an angle Φ of 180 degrees.

It should be noted that, each of the metal wires 3 of the present embodiment is embedded in two different insulators (e.g., the combining layer 52 and the packaging compound 53), and all of the metal wires 3 cannot be formed with any fail problems for establishing the electrical connection between the sensor chip 2 and the substrate 1, so that the structure of each of the metal wires 3 need to overcome the above issues. Accordingly, the metal wires 3 of the present embodiment can overcome the above issues by implementing at least part of the following conditions of each of the metal wires 3.

As the metal wires 3 are of the same structure, the following description discloses the structure of just one of the metal wires 3 for the sake of brevity. Specifically, the metal wire 3 has a diameter W within a range of 0.8-1.1 mil. The metal wire 3 includes a first segment 32 connected to the corresponding welding pad 111 and a second segment 33 connected to the corresponding connecting pad 215. The apex 31 of the metal wire 3 is substantially arranged between the first segment 32 and the second segment 33. The second segment 33 integrally and curvedly extends from an end of the first segment 32 away from the corresponding welding pad 111. The second segment 33 and the top surface 21 of the sensor chip 2 have a sloping angle σ there-between that is within a range of 5-45 degrees, and the sloping angle σ is preferably within a range of 10-30 degrees.

Moreover, in order to form a stronger structure of the metal wire 3 and to have a smaller size of the sensor package structure 100, a portion of each of the welding pads 111 connected to the first segment 32 of the corresponding metal wire 3 can be spaced apart from the lateral side 23 of the sensor chip 2 by a suitable distance L that is within a range of 210-660 μm. Specifically, the distance L is preferably within a range of 390-460 μm for the structure of the sensor package structure 100 shown in FIG. 1.

Second Embodiment

Figure 10:
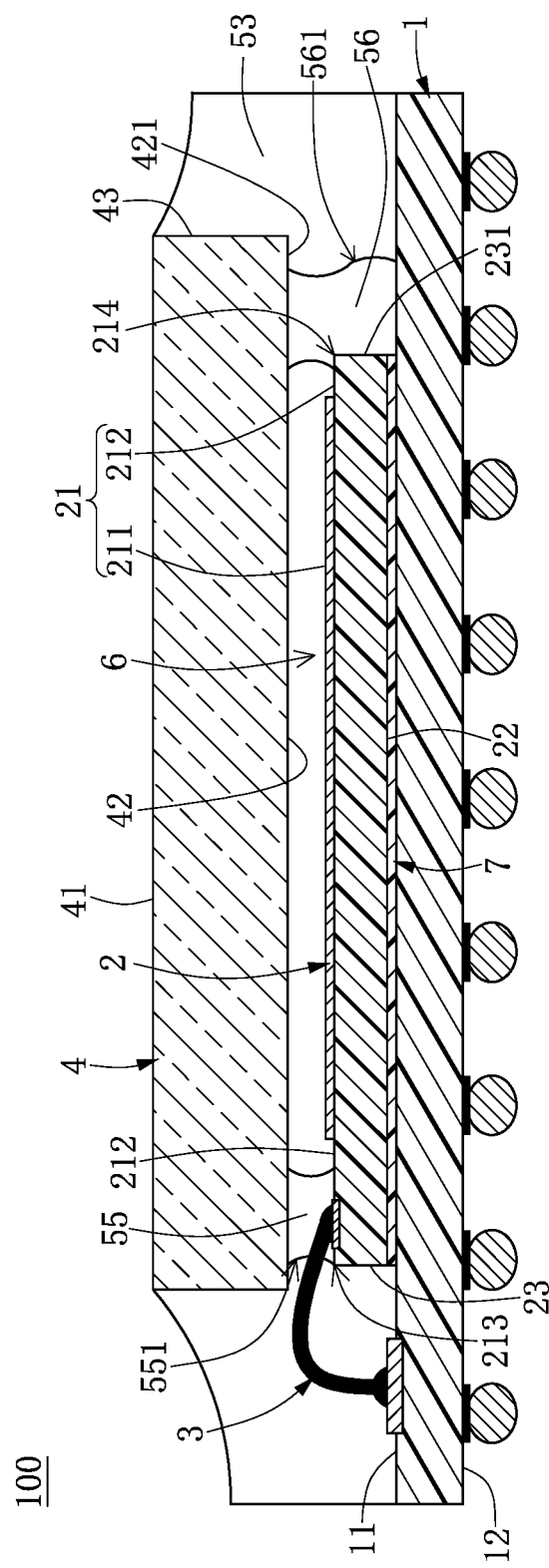
FIG. 10 is a cross-sectional view showing a sensor package structure according to a second embodiment of the present disclosure.

Reference is made to FIG. 10, which illustrates a second embodiment of the present disclosure. The present embodiment is similar to the first embodiment, except that in the second embodiment, the combining layer 52 and the supporting layer 51 are replaced by a first combining layer 55 and a second combining layer 56. Specifically, in the present embodiment, the supporting layer 51 and a portion of the combining layer 52 disposed on the supporting layer 51 (as shown in FIG. 5) as disclosed in the first embodiment are adjusted to be formed in one process and are co-defined as the second combining layer 56, and the other portion of the combining layer 52 (as shown in FIG. 6) is adjusted to be formed in another process and is defined as the first combining layer 55, but the present disclosure is not limited thereto. The structural features of the present embodiment different from the first embodiment are disclosed as follows.

The first combining layer 55 is disposed on the first portion of the top surface 21 between the first edge 213 and the spacing region 212. The second combining layer 56 is disposed on the upper surface 11 of the substrate 1 and is arranged adjacent to the second edge 214 of the sensor chip 2 (i.e., the second combining layer 56 contacts the side surface 231 of the sensor chip 2). The second combining layer 56 can be further disposed on the second portion of the top surface 21 between the second edge 214 and the spacing region 212, and an area of the second portion of the top surface 21 is smaller than that of a portion of the spacing region 212 connected to the second portion of the top surface 21. A height of the second combining layer 56 with respect to the upper surface 11 of the substrate 1 is substantially equal to that of the first combining layer 55 with respect to the upper surface 11 of the substrate 1.

Moreover, a largest distance between an upper half of an outer side 561 of the second combining layer 56 and the sensing region 211 is substantially equal to a distance between the first edge 213 and the sensing region 211. An outer side 551 of the first combining layer 55 arranged distant from the sensing region 211 includes an arc surface 551 having a center of circle located in the packaging compound 53. In a cross-section of the sensor package structure 100 perpendicular to the upper surface 11 of the substrate 1, the outer side 561 of the second combining layer 56 arranged distant from the sensor chip 2 is in an S-shape, but the present disclosure is not limited thereto (e.g., FIG. 5B).

A portion of the second surface 42 of the light-permeable layer 4 is adhered to the first combining layer 55 and the second combining layer 56. The second surface 42 has a fixing region 421 arranged outside the portion of the second surface 42 adhered to the first combining layer 55 and the second combining layer 56.

The packaging compound 53 is disposed on the upper surface 11 of the substrate 1 and covers the lateral side 23 of the sensor chip 2, the outer side 551 of the first combining layer 55, the outer side 561 of the second combining layer 56, and the lateral side 43 and the fixing region 421 of the light-permeable layer 4. A part of each of the metal wires 3 and each of the welding pads 111 are embedded in the packaging compound 53.

Third Embodiment

Figure 11:
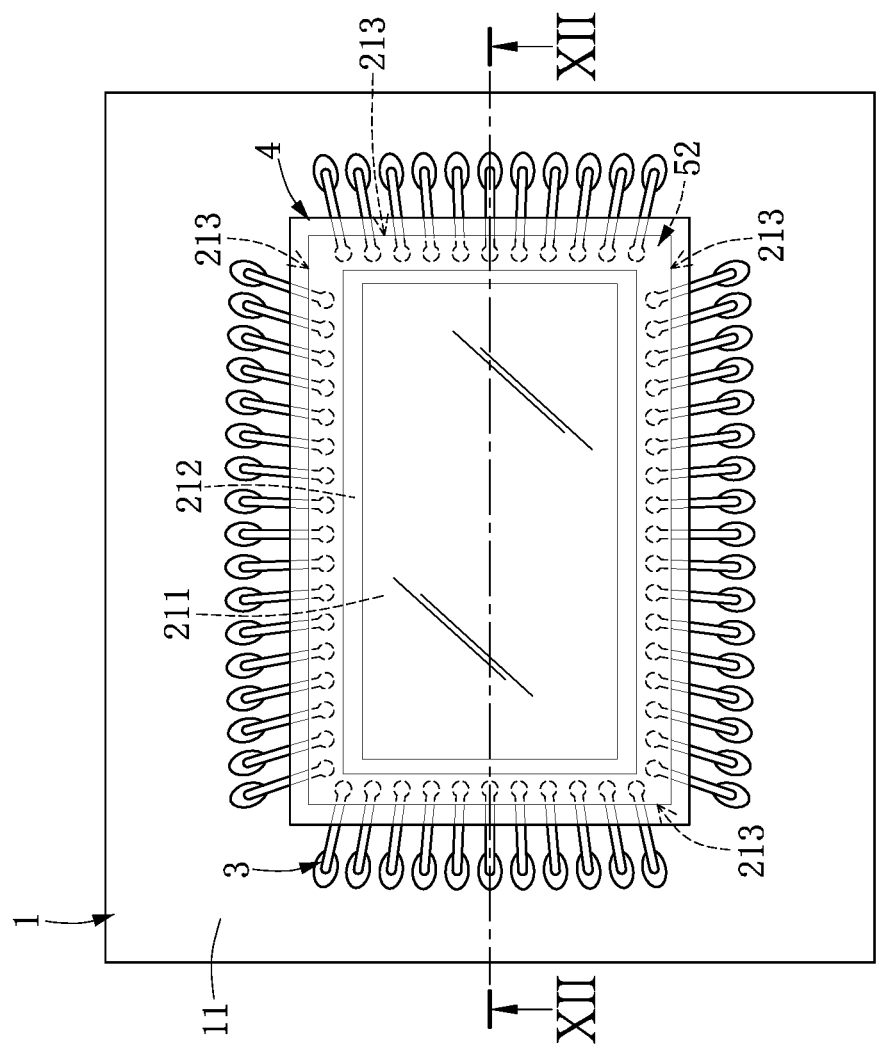
FIG. 11 is a top view showing a sensor package structure according to a third embodiment of the present disclosure.
Figure 12:
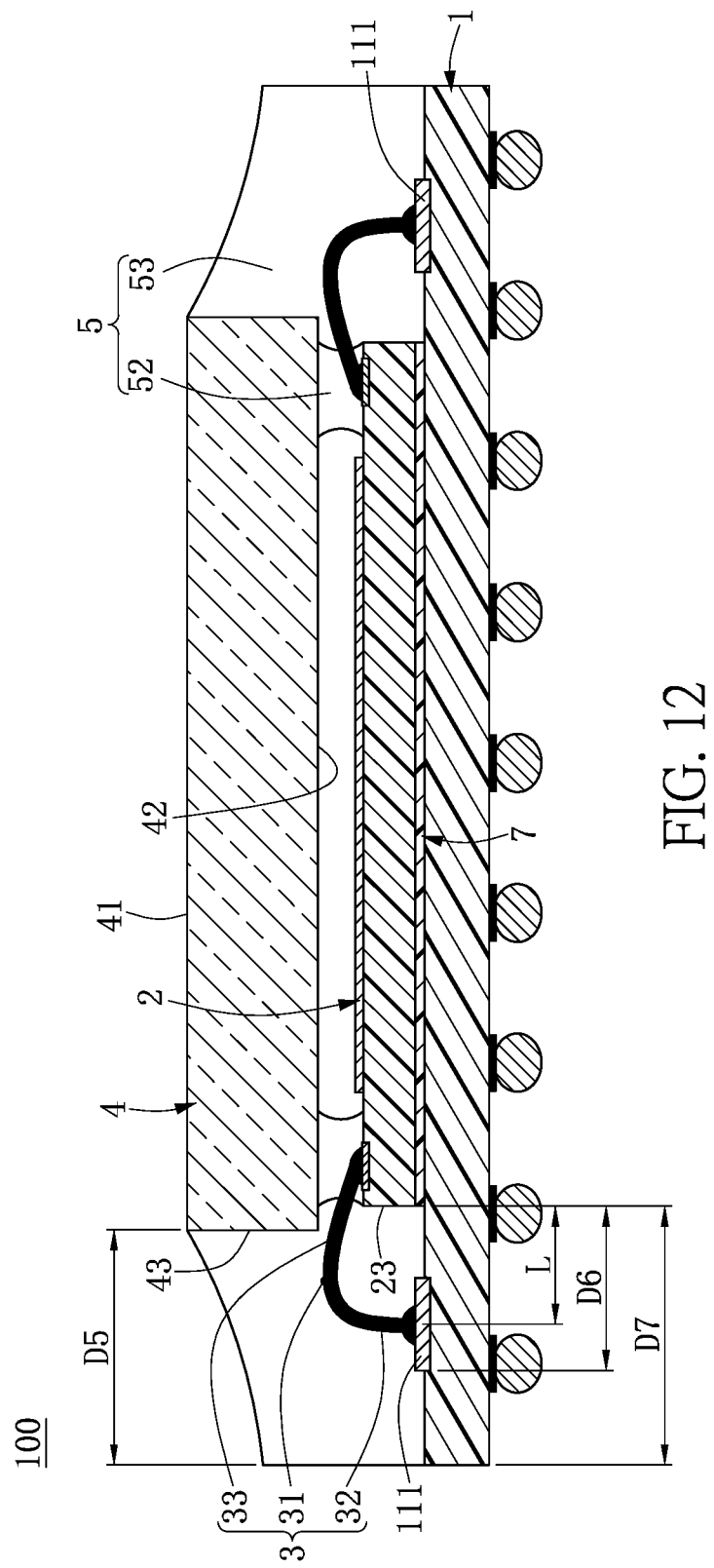
FIG. 12 is a cross-sectional view taken along line XII-XII of FIG. 11.

Reference is made to FIG. 11 and FIG. 12, which illustrate a third embodiment of the present disclosure. The present embodiment is similar to the first embodiment, except that the sensor package structure 100 of the third embodiment is provided without any supporting layer 51; that is to say, the edges of the top surface 21 of the sensor chip 2 in the present embodiment are first edges 213.

It should be noted that the size of the sensor package structure 100 as disclosed in the above three embodiments can be reduced. Specifically, as shown in FIG. 12, a distance D5 between the lateral side 43 of the light-permeable layer 4 and an adjacent side of the packaging compound 53 is substantially 300~500 μm, a largest distance D6 between a lateral side of each of the welding pads 111 and an adjacent portion of the lateral side 23 of the sensor chip 2 is substantially 200~350 μm, and a distance D7 between the portion of the lateral side 23 of the sensor chip 2 adjacent to at least one of the welding pads 111 and an adjacent side surface of the packaging compound 53 is substantially 375~575 μm. Thus, the size of the sensor package structure 100 is smaller than that of the conventional sensor package structure, and the amount of the packing compound 53 of the sensor package structure 100 is less than that of the conventional sensor package structure, so that the thermal expansion and contraction of the packaging compound 53 generates less stress to the sensor package structure 100, thereby increasing the reliability of the sensor package structure 100.

Moreover, in order to form a stronger structure of the metal wire 3 and to have a smaller size of the sensor package structure 100, a portion of each of the welding pads 111 connected to the first segment 32 of the corresponding metal wire 3 can be spaced apart from the lateral side 23 of the sensor chip 2 by a suitable distance L that is within a range of 210-660 μm. Specifically, the distance L is preferably within a range of 210-360 μm for the structure of the sensor package structure 100 shown in FIG. 12.

Fourth Embodiment

Figure 13:
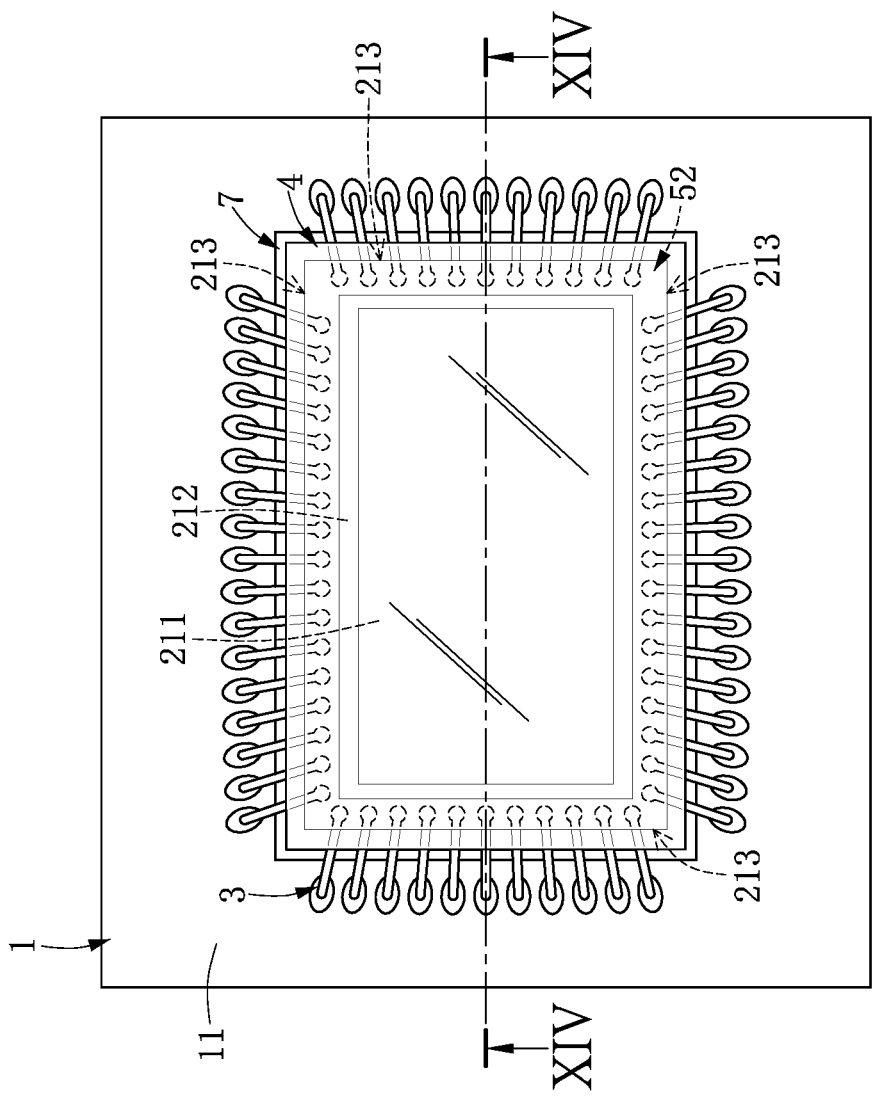
FIG. 13 is a top view showing a sensor package structure according to a fourth embodiment of the present disclosure.
Figure 14:
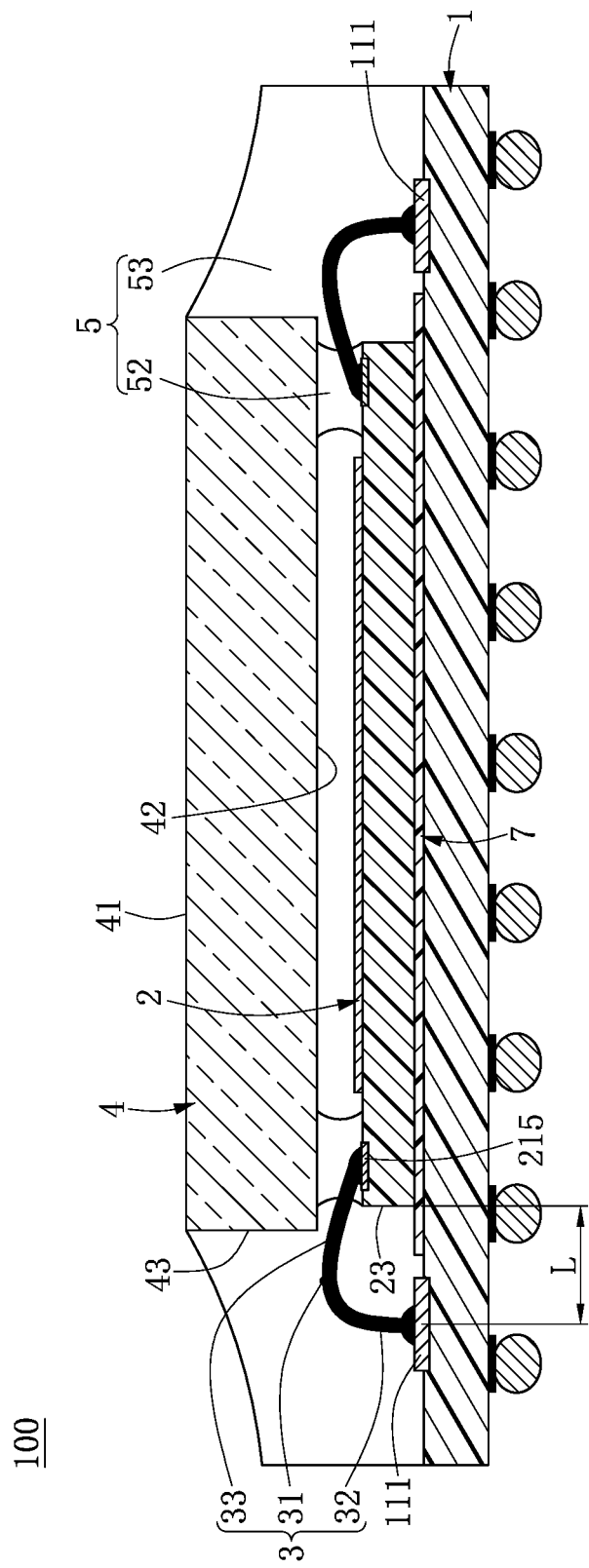
FIG. 14 is a cross-sectional view taken along line XIV-XIV of FIG. 13 according to the fourth embodiment of the present disclosure.

Reference is made to FIG. 13 and FIG. 14, which illustrate a fourth embodiment of the present disclosure. The present embodiment is similar to the first embodiment to the third embodiment, and the difference between the present embodiment and the above three embodiments is described as follows.

In the present embodiment, the bottom surface 22 of the sensor chip 2 is entirely adhered to the upper surface 11 of the substrate 1 through the chip-bonding adhesive 7, and the chip-bonding adhesive 7 protrudes from the lateral side 23 of the sensor chip 2 so as to ensure no bubble generated between the bottom surface 22 of the sensor chip 2 and the upper surface 11 of the substrate 1. Specifically, a portion of the chip-bonding adhesive 7 protruding from the lateral side 23 of the sensor chip 2 is arranged around the lateral side 23, thereby ensuring that the chip-bonding adhesive 7 is adhered to entire of the bottom surface 22 of the sensor chip 2 and a portion of the upper surface 11 of the substrate 1 that faces the bottom surface 22 of the sensor chip 2. Moreover, the portion of each of the welding pads 111 connected to the first segment 32 of the corresponding metal wire 3 can be spaced apart from the lateral side 23 of the sensor chip 2 by the distance L to further allow the welding pads 111 being spaced apart from the chip-bonding adhesive 7.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate having an upper surface and a lower surface opposite to the upper surface, wherein the substrate includes a plurality of welding pads formed on the upper surface;
a sensor chip and a chip-bonding adhesive, wherein the sensor chip has a top surface, a bottom surface opposite to the top surface, and a lateral side arranged between the top surface and the bottom surface, the bottom surface of the sensor chip is entirely adhered to the upper surface of the substrate through the chip-bonding adhesive, and the chip-bonding adhesive protrudes from the lateral side of the sensor chip so as to ensure no bubble generated between the bottom surface of the sensor chip and the upper surface of the substrate, and wherein the top surface has a sensing region and a spacing region arranged around the sensing region, the top surface has a plurality of edges, and the sensor chip includes a plurality of connecting pads formed on a portion of the top surface between the spacing region and at least one of the edges;
a plurality of metal wires, wherein one ends of the metal wires are respectively connected to the welding pads, and the other ends of the metal wires are respectively connected to the connecting pads, wherein each of the metal wires has a diameter within a range of 0.8-1.1 mil, and includes:
a first segment connected to the corresponding welding pad; and
a second segment connected to the corresponding connecting pad, wherein in each of the metal wires, the second segment integrally and curvedly extends from an end of the first segment away from the corresponding welding pad, and the second segment and the top surface of the sensor chip have a sloping angle there-between that is within a range of 5-45 degrees,
wherein a portion of each of the welding pads connected to the first segment of the corresponding metal wire is spaced apart from the lateral side of the sensor chip by a distance that is within a range of 210-660 μm so as to allow the welding pads being spaced apart from the chip-bonding adhesive;
a combining layer disposed on the portion of the top surface between the at least one of the edges of the top surface and the spacing region, wherein a part of the second segment of each of the metal wires is embedded in the combining layer;

a light-permeable layer having a first surface and a second surface opposite to the first surface, a portion of the second surface of the light-permeable layer being adhered to the combining layer, wherein the second surface has a fixing region arranged outside the portion of the second surface adhered to the combining layer, and a projecting area defined by orthogonally projecting the sensor chip onto the second surface is entirely located in the second surface; and a packaging compound disposed on the upper surface of the substrate and covering the lateral side of the sensor chip, a lateral side of the combining layer, and a lateral side and the fixing region of the light-permeable layer, wherein the first segment and the other part of the second segment of each of the metal wires and each of the welding pads are embedded in the packaging compound.

2. The sensor package structure according to claim 1, wherein in each of the metal wires, the sloping angle is limited to be within a range of 10-30 degrees.

3. The sensor package structure according to claim 1, wherein the distance between the lateral side of the sensor chip and the portion of each of the welding pads is within a range of 210-360 μm.

4. The sensor package structure according to claim 1, wherein the distance between the lateral side of the sensor chip and the portion of each of the welding pads is within a range of 390-460 μm.

5. The sensor package structure according to claim 1, wherein each of the metal wires has an apex arranged between the first segment and the second segment thereof, and a height of the apex of each of the metal wires with respect to the top surface of the sensor chip is smaller than a height of the second surface of the light-permeable layer with respect to the top surface of the sensor chip.

6. The sensor package structure according to claim 5, wherein the height of the second surface of the light-permeable layer with respect to the top surface of the sensor chip is within a range of 120-200 μm, and the height of the apex of each of the metal wires with respect to the top surface of the sensor chip is within a range of 30-150 μm.

7. The sensor package structure according to claim 6, wherein the height of the apex of each of the metal wires with respect to the top surface of the sensor chip is within a range of 50-100 μm.

8. A sensor package structure, comprising:
a substrate having an upper surface and a lower surface opposite to the upper surface, wherein the substrate includes a plurality of welding pads formed on the upper surface;
a sensor chip having a top surface, a bottom surface opposite to the top surface, and a lateral side arranged between the top surface and the bottom surface, the bottom surface of the sensor chip being disposed on the upper surface of the substrate, the top surface having a sensing region and a spacing region arranged around the sensing region, wherein the top surface has a plurality of edges, and the sensor chip includes a plurality of connecting pads formed on a portion of the top surface between the spacing region and at least one of the edges;
a plurality of metal wires, wherein one ends of the metal wires are respectively connected to the welding pads, and the other ends of the metal wires are respectively connected to the connecting pads, wherein each of the metal wires has a diameter within a range of 0.8-1.1 mil, and includes:
a first segment connected to the corresponding welding pad; and
a second segment connected to the corresponding connecting pad, wherein in each of the metal wires, the second segment integrally and curvedly extends from an end of the first segment away from the corresponding welding pad, and the second segment and the top surface of the sensor chip have a sloping angle there-between that is within a range of 5-45 degrees;

a combining layer disposed on the portion of the top surface between the at least one of the edges of the top surface and the spacing region, wherein a part of the second segment of each of the metal wires is embedded in the combining layer;

a light-permeable layer having a first surface and a second surface opposite to the first surface, a portion of the second surface of the light-permeable layer being adhered to the combining layer, wherein the second surface has a fixing region arranged outside the portion of the second surface adhered to the combining layer, and a projecting area defined by orthogonally projecting the sensor chip onto the second surface is entirely located in the second surface; and a packaging compound disposed on the upper surface of the substrate and covering the lateral side of the sensor chip, a lateral side of the combining layer, and a lateral side and the fixing region of the light-permeable layer, wherein the first segment and the other part of the second segment of each of the metal wires and each of the welding pads are embedded in the packaging compound.

9. The sensor package structure according to claim 8, wherein a portion of each of the welding pads connected to the first segment of the corresponding metal wire is spaced apart from the lateral side of the sensor chip by a distance that is within a range of 210-660 μm.

10. The sensor package structure according to claim 9, wherein the distance between the lateral side of the sensor chip and the portion of each of the welding pads is within a range of 210-360 μm.

11. The sensor package structure according to claim 9, wherein the distance between the lateral side of the sensor chip and the portion of each of the welding pads is within a range of 390-460 μm.

12. The sensor package structure according to claim 8, wherein in each of the metal wires, the sloping angle is limited to be within a range of 10-30 degrees.

13. The sensor package structure according to claim 8, wherein each of the metal wires has an apex arranged between the first segment and the second segment thereof, and a height of the apex of each of the metal wires with respect to the top surface of the sensor chip is smaller than a height of the second surface of the light-permeable layer with respect to the top surface of the sensor chip.

14. The sensor package structure according to claim 13, wherein height of the second surface of the light-permeable layer with respect to the top surface of the sensor chip is within a range of 120-200 μm, and the height of the apex of each of the metal wires with respect to the top surface of the sensor chip is within a range of 30-150 μm.

15. The sensor package structure according to claim 14, wherein the height of the apex of each of the metal wires with respect to the top surface of the sensor chip is within a range of 50-100 μm.

* * * * *